United States Patent
Su et al.

(10) Patent No.: US 7,187,254 B2
(45) Date of Patent: *Mar. 6, 2007

(54) FILM BULK ACOUSTIC RESONATOR FILTERS WITH A COPLANAR WAVEGUIDE

(75) Inventors: Qingxin Su, Xi'an (CN); Paul B. Kirby, Northampton (GB); Eiju Komuro, Chiba (JP); Masaaki Imura, Shizuoka (JP); Roger W. Whatmore, Milton Keynes (GB)

(73) Assignee: TDK Corporation, Tokyo (JP)

( * ) Notice: Subject to any disclaimer, the term of this patent is extended or adjusted under 35 U.S.C. 154(b) by 786 days.

This patent is subject to a terminal disclaimer.

(21) Appl. No.: 10/380,985

(22) PCT Filed: Jul. 11, 2001

(86) PCT No.: PCT/GB01/03141

§ 371 (c)(1),
(2), (4) Date: Mar. 20, 2003

(87) PCT Pub. No.: WO02/45265

PCT Pub. Date: Jun. 6, 2002

(65) Prior Publication Data

US 2004/0061416 A1 Apr. 1, 2004

(30) Foreign Application Priority Data

Nov. 29, 2000 (GB) .................... 0029090.8

(51) Int. Cl.
*H03H 9/54* (2006.01)

(52) U.S. Cl. ...................... 333/189; 333/192

(58) Field of Classification Search ............... 333/187, 333/189

See application file for complete search history.

(56) References Cited

U.S. PATENT DOCUMENTS

| 5,185,589 | A  |   | 2/1993  | Krishnaswamy et al. ... 333/133 |
|-----------|----|---|---------|---------------------------------|
| 5,942,958 | A  |   | 8/1999  | Lakin ...................... 333/189 |
| 6,051,907 | A  |   | 4/2000  | Ylilammi .................. 310/312 |
| 6,774,746 | B2 | * | 8/2004  | Whatmore et al. ......... 333/189 |
| 6,977,563 | B2 | * | 12/2005 | Komuro et al. ............. 333/187 |
| 7,046,103 | B2 | * | 5/2006  | Whatmore et al. ......... 333/204 |
| 2004/0150295 | A1 | * | 8/2004 | Komuro et al. ............. 310/324 |

FOREIGN PATENT DOCUMENTS

| EP | 0 865 157 A2 | 9/1998 |
| EP | 0 880 227 A2 | 11/1998 |
| EP | 0 949 756 A2 | 10/1999 |

* cited by examiner

*Primary Examiner*—Barbara Summons
(74) *Attorney, Agent, or Firm*—Oliff & Berridge, PLC

(57) ABSTRACT

Multiple thin film bulk acoustic resonators (10, 11) configured in series (10) and parallel (11) within a coplanar waveguide line structure provides a compact ladder filter. The resonators (10, 11) are formed over an opening (28) in a substrate (20) and connected to associated circuitry by one or more transmission lines formed on the substrate (20). The arrangement of the resonators (10, 11) between the ground and signal lines of a coplanar line structure provides a means of minimising the area of the filter. Embedding a ladder filter within the coplanar transmission line structure eliminates the need for wire bonds, thus simplifying fabrication. Embodiments for 2×2, and hither order filters are described.

12 Claims, 6 Drawing Sheets

FILM BULK ACOUSTIC RESONATOR FILTERS WITH A COPLANAR WAVEGUIDE

The present invention concerns improvements in or relating to filters, in particular to film bulk acoustic resonator (FBAR) filters, and more especially to the configuration of FBAR filters operating at microwave frequencies which can be simply fabricated using thin film technologies.

It is important to prepare filters at high frequency in the MHz or GHz region because those frequency regions are often used for wireless communications these days. For such applications it is important that the filter is as small size as possible. Therefore, filter configurations are demanded which minimise the size of the filter on the substrate surface.

FBARs are attractive devices since they show resonant peaks at high frequency particularly in the MHz and GHz regions. Moreover, FBARs can be achieved in a small device (size ~100 microns). Thus, they are considered to be useful for installation in small, light, thin electric appliance products, such as mobile phones.

FBARs are fabricated by depositing thin film piezoelectric layers, typically zinc oxide (ZnO), aluminium nitride (AlN) or lead zirconium titanate (PZT) onto a membrane or acoustic quarter wavelength stack formed on a semiconductor substrate. This combination forms an acoustic structure which is resonant at a specific frequency.

Prior art FBAR devices are coupled to associated circuitry by means of contact pads and wire bonds. This method provides a poorly defined ground connection because of the parasitic inductance of the wire leads. This approach also makes simulations and analysis of results difficult.

An alternative approach of incorporating the FBAR within a coplanar waveguide (CPW) structure involves the signal connection of the ground-signal-ground connection making contact to the top and bottom of the piezoelectric layer. In the known arrangement the electrodes are separate from the transmission line structure. This increases the area and limits the size of device that can be produced.

The present invention seeks to overcome or mitigate the disadvantages of existing FBARs and allows more compact filter configurations to be obtained with multiple FBARs.

It is a preferred object of the present invention to provide a filter comprising a plurality of FBARs, and more particularly a piezoelectric filter, which is manufactured using thin film technology in order to minimise the planar area of the filter area on the wafer surface.

It is yet another preferred object of the present invention to provide a filter made from a plurality of FBARs that is miniature and shows low close-in rejection and low out-of-band rejection.

These and other objects of the present invention are broadly achieved by an arrangement of FBAR devices within a coplanar waveguide structure wherein the electrodes are incorporated in the coplanar transmission lines.

Thus according to one aspect of the invention there is provided an electric filter comprising a plurality of FBARs consisting of a thin layer of piezoelectric material sandwiched between two metal layers, the FBARs being linked in a series and parallel connection arrangement such that the series FBARs electrodes form part of the signal line of a coplanar waveguide transmission line, while the parallel FBAR electrodes are linked to one side or both sides of the ground coplanar transmission line.

By configuring the filter as a CPW structure, a compact filter is obtained that is not susceptible to stray parasitic effects. Furthermore, incorporating the filter within the coplanar transmission line structure eliminates the need for wire bonds, thereby simplifying fabrication.

Preferably the filter is a ladder filter in which the series FBARs form one group and the parallel FBARs form another group. The advantage of the ladder filter configuration is that additional passive capacitance and inductors that take up additional area are not required. Generally speaking, for a band-pass filter, the rejection level compared to the signal-pass area improves when more FBARs are used in the filter.

Typically, the series FBARs have identical areas and thicknesses and similarly the parallel FBARs have identical areas and thicknesses although both area and thickness can be different for the series and parallel FBARs. Identical series FBAR will be referred to as an "A" type FBAR, identical parallel FBARs will be referred to as a "B" type FBAR.

The series and parallel FBARs may be arranged in an ABAB sequence or in an ABBA sequence. The ABAB configuration in a CPW structure takes up more area compared to the ABBA configuration and adopting the ABBA configuration enables full use to be made of the device area.

The ABBA configuration within a CPW is also well suited to simple fabrication of a miniature filter using thin film technology and also allows easy fabrication of higher order filters without having to pattern the piezoelectric layer.

The FBARs may be positioned without air-bridges or metal tracks formed over the edge of the piezoelectric layer.

Advantageously, the piezoelectric material is selected from the group comprising zinc oxide, aluminium nitride, lead titanate zirconate, lead scandium tantalum oxide and bismuth sodium titanium oxide.

Preferably, access is provided to electrodes for poling ferroelectric FBAR filters.

According to another aspect of the invention, there is provided a ladder filter comprising series and parallel FBARs arranged within a coplanar waveguide structure such that a top electrode of each series FBAR forms part of a signal line of the coplanar waveguide structure and a top electrode of each parallel FBAR forms part of a ground line of the coplanar waveguide structure.

Preferably, the signal line is positioned between two ground lines.

Advantageously, the FBARs of the filters according to both aspects of the invention have a common bottom electrode.

According to a further aspect of the invention, there is provided a ladder filter comprising a plurality of FBARs in series and parallel configuration within a coplanar waveguide structure wherein the FBARs have electrodes formed as part of transmission lines of the coplanar waveguide structure.

According to a still further aspect of the present invention, there is provided a ladder filter comprising a plurality of FBARs in series and parallel configuration within a coplanar waveguide structure wherein the FBARs formed on a substrate are connected to associated circuitry by one or more transmission lines formed on the substrate.

According to yet another aspect of the present invention, there is provided a ladder filter comprising a plurality of FBARs in series and parallel configuration included within a transmission line structure of a coplanar waveguide.

Embodiments of the invention are now described in more detail, by way of example only, with reference to the accompanying drawings wherein.

Figures 1A, 1B:
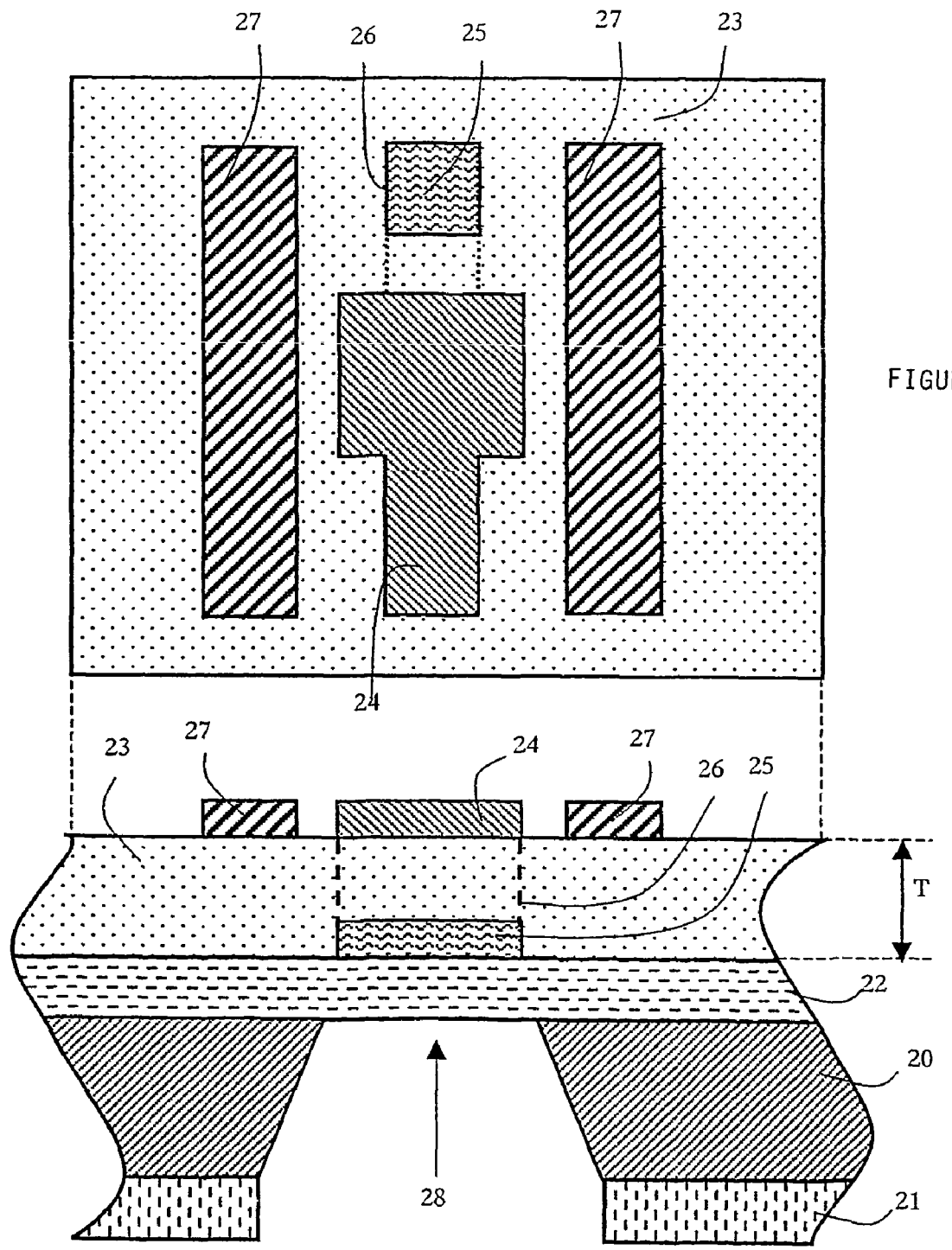
FIG. 1A is a top view of an FBAR.
FIG. 1B is a cross-section view of the FBAR shown in FIG. 1A.

Referring first to FIGS. 1A and 1B, a top view and a cross section view of a standard FBAR are shown. The FBAR is arranged on the signal line of a ground-signal-ground line of a coplanar transmission line The device is configured for 2-port measurements so ground probes can be positioned at either end of ground electrodes 27, one signal probe can be positioned through a contact hole 26 onto the bottom electrode 25, and the other signal probe can be positioned at the end of the top electrode 24.

The dimensions of the coplanar transmission lines are designed to provide the system with a 50 ohm environment however there is enough design flexibility to allow the distance between ground and signal lines to be altered to accommodate FBARs of varying area while minimising the overall size of the FBAR and FBAR filter.

The FBAR consists of a continuous piezoelectric layer 23 deposited on an insulating layer 22. An input electrode which forms the bottom electrode 25 of the FBAR is formed on the insulating layer 22 and is configured as part of the signal line of a coplanar transmission line.

The region of overlap of the signal line defined on the insulating layer 22 and that part of the signal line defined on the top of the piezoelectric layer 23 is positioned above the opening 28 in the substrate 20. The opening 28 is prepared by etching using backside pattern 21.

The output transmission line extends to measurement points or to other FBARs arranged in a ladder configuration. Using a continuous piezoelectric thin film, the input and output electrode must be defined before and after the deposition of the piezoelectric thin film. When the top electrode 24 is prepared, two ground electrodes 27 are prepared at the same time so that the top electrode 24 has a coplanar wave-guide structure for which the characteristic impedance is set to about 50 ohms.

Access to the bottom electrode 25 of the FBAR for measurements is achieved by etching a contact hole 26. The size of the working area, which is equal to the centre part of the top electrode 24 and the bottom electrode 25, is typically 50–200 microns square for ZnO and 20–45 microns square for PZT.

Figure 2:
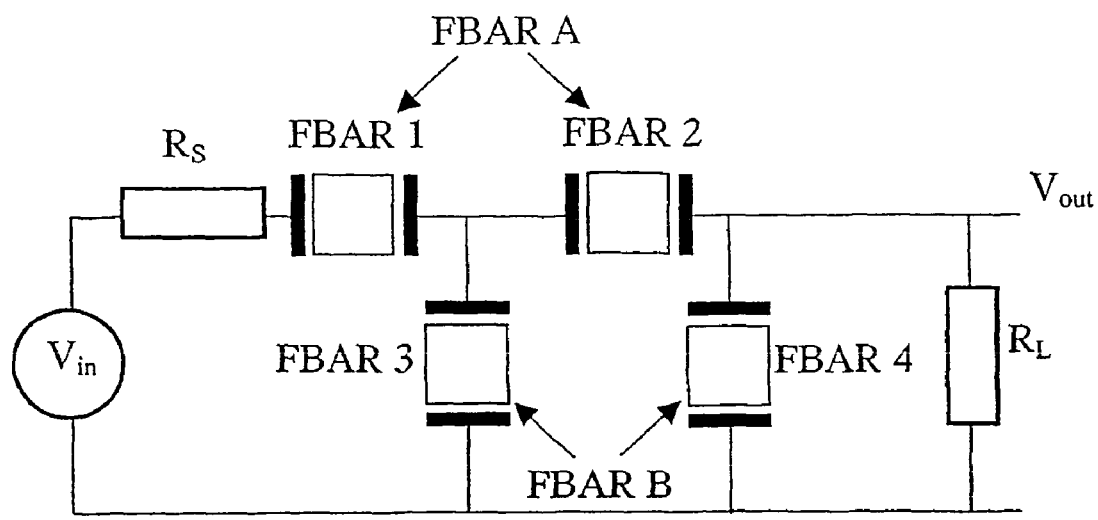
FIG. 2 is a schematic diagram of an ABAB ladder filter.
Figure 3:
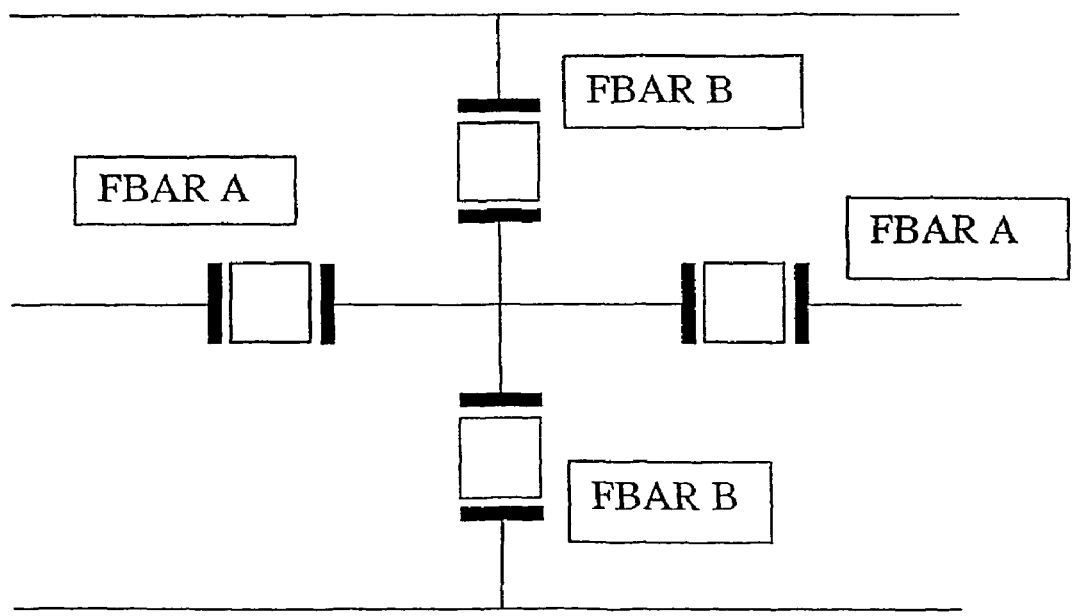
FIG. 3 is a schematic diagram of an ABBA ladder filter.
Figure 4A:
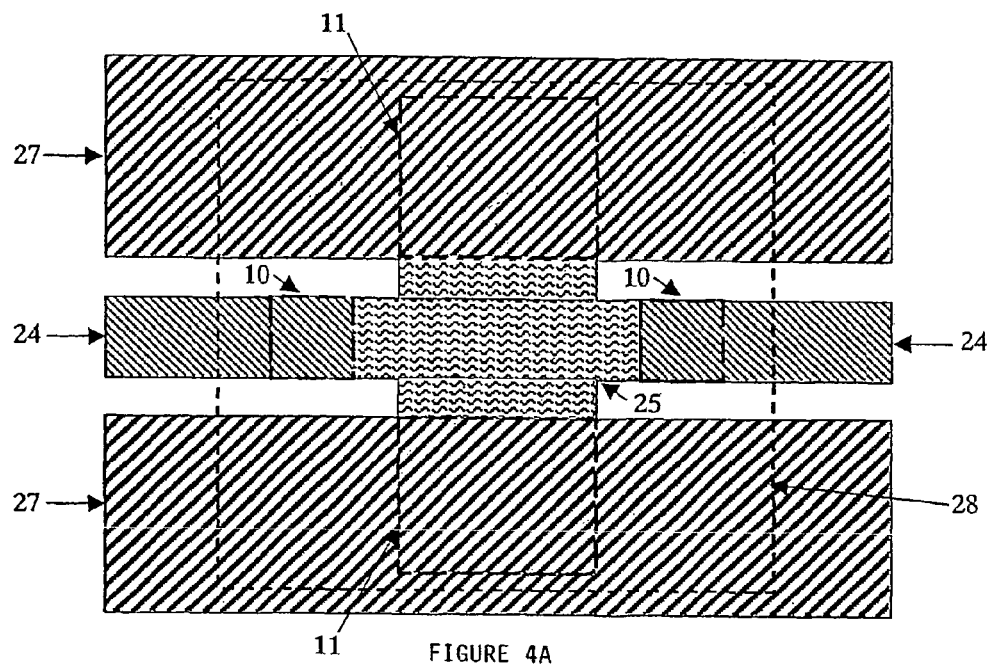
FIG. 4A is a top view of a ladder filter according to a first embodiment of the invention having the ABBA configuration shown in FIG. 3.
Figure 4B:
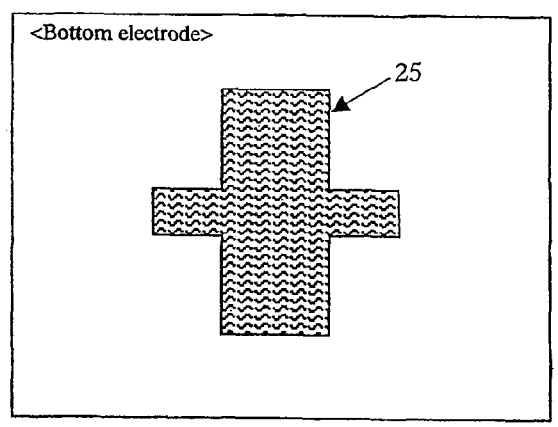
FIG. 4B shows the bottom electrode of the ABBA ladder filter shown in FIG. 4A.
Figure 4C:
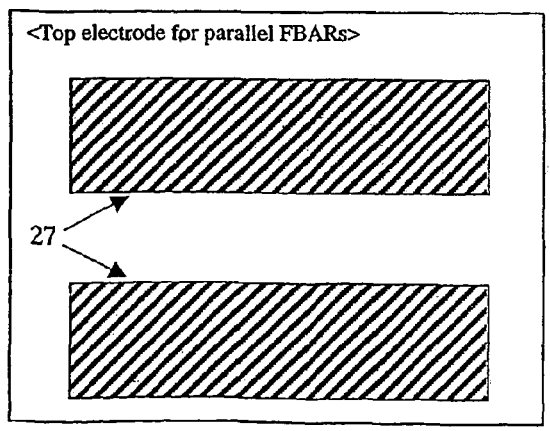
FIG. 4C shows the top electrode for the parallel FBARs of the ABBA ladder filter shown in FIG. 4A.
Figure 4D:
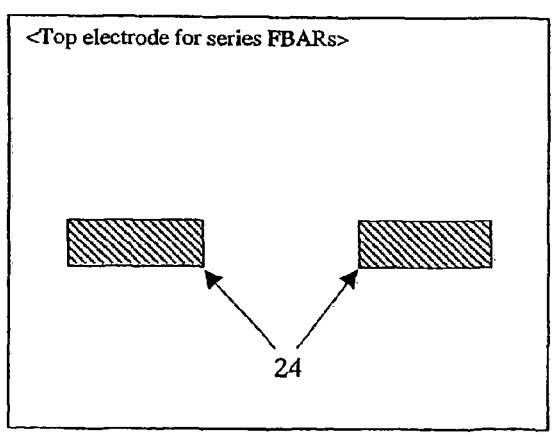
FIG. 4D shows the top electrode for the series FBARs of the ABBA ladder filter shown in FIG. 4A.
Figure 5A:
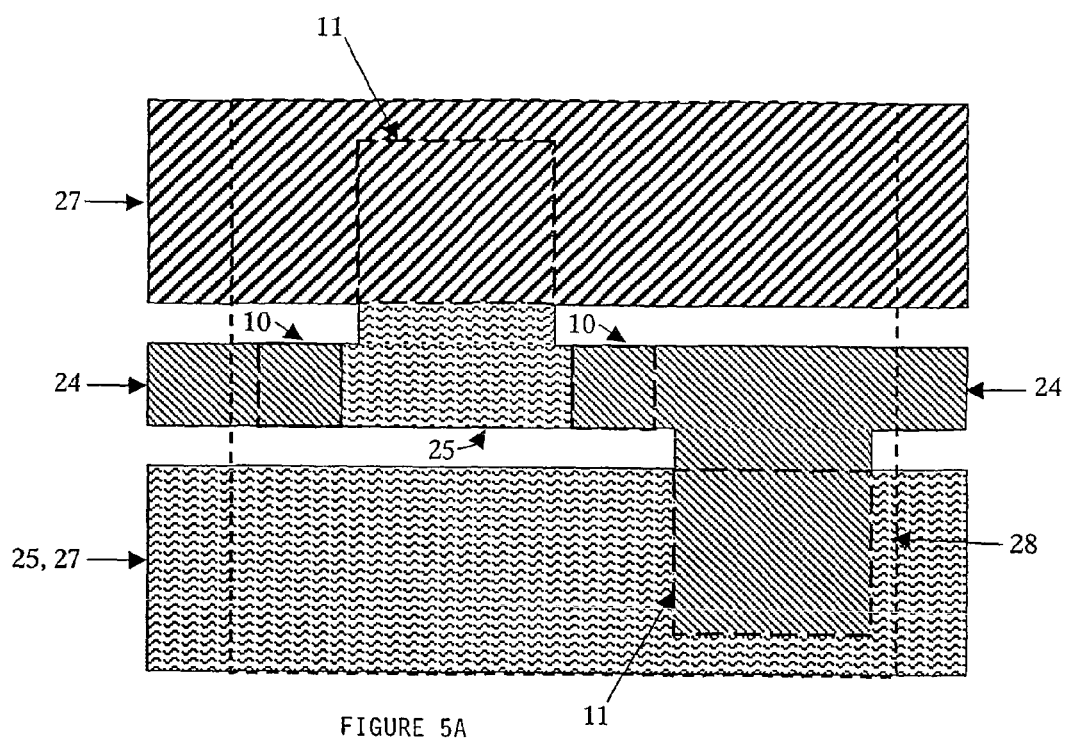
FIG. 5A is a top view of a ladder filter according to a second embodiment of the invention having the ABAB configuration shown in FIG. 2.
Figure 5B:
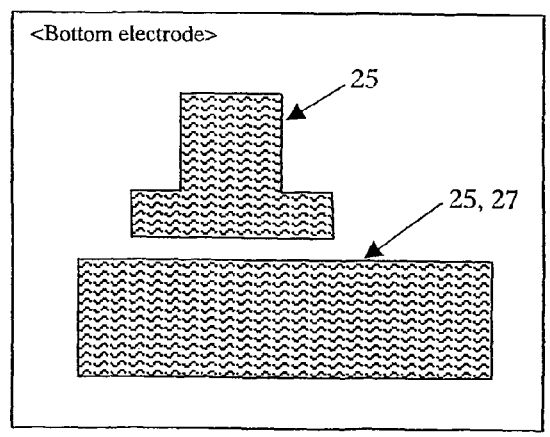
FIG. 5B shows the bottom electrode of the ABAB ladder filter shown in FIG. 5A.
Figure 5C:
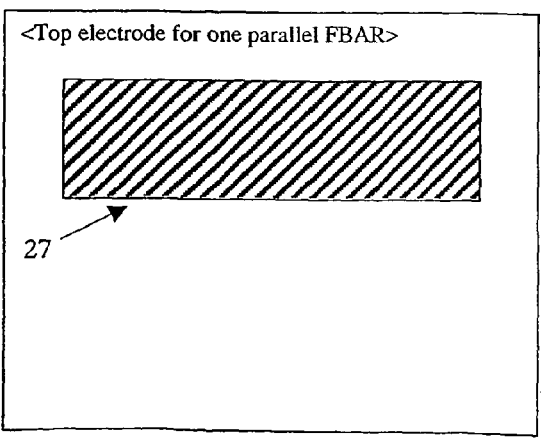
FIG. 5C shows the top electrode for the parallel FBARs of the ABAB ladder filter shown in FIG. 5A.
Figure 5D:
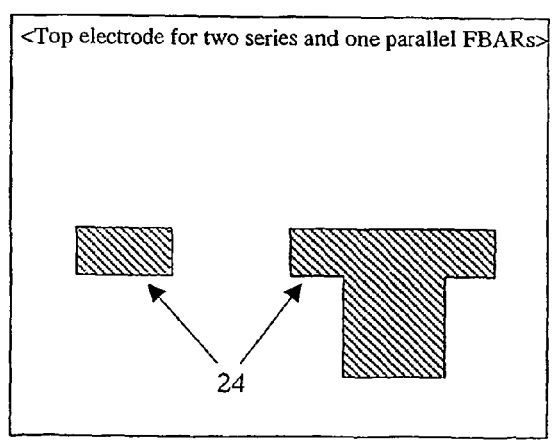
FIG. 5D shows the top electrode for the series FBARs of the ABAB ladder filter shown in FIG. 5A.

FIGS. 2 and 3 are schematic views of two arrangements of series and parallel FBARs to form ladder filters. Each filter comprises two FBARs in series and two FBARs in parallel. Such filters are referred to by a common nomenclature, as 2×2 ladder filters where the first numeral refers to the number of series resonators and the second numeral to the number of parallel resonators. For convenience herein, the series resonators will be denoted A and the parallel resonators B. The series resonators A may often differ in area and thickness from the parallel resonators B. All series resonators A are identical and all parallel resonators B are identical.

The arrangement of FBARs in FIGS. 2 and 3 differ in terms of the grounding sequence. The arrangement in FIG. 2 is here referred to as ABAB whereas that in FIG. 3 is referred to as the ABBA configuration with these terms describing the sequence of the series and parallel resonators.

The realisation of the 2×2 filter in the ABBA coplanar configuration shown in FIG. 3 is illustrated in FIGS. 4A–D with dimensions suitable for a ZnO piezoelectric layer 23 while that of the 2×2 filter in ABAB coplanar configuration shown in FIG. 2 is illustrated in FIGS. 5A–D.

The series FBARs 10 and the parallel FBARs 11 are positioned on a single membrane structure. The invention simplifies the processing considerably and eliminates the need to pattern by etching the ZnO piezoelectric layer 23. For the ABBA and ABAB configurations within a coplanar transmission line, one layer forms the bottom electrode 25 of all four FBARs that make up the 2×2 filter.

As a result of using ABBA configured filter within CPW, certain orders of ladder filters, in which the number of parallel FBARs is equal or bigger than that of the series FBARs, such as ABBABBA (3/4), ABBABBAA (4/4) are easier to fabricate within a CPW.

For filters with ABAB configuration in simple CPW, it is difficult to fabricate filters with the same number of series and parallel FBARs, such as ABABAB (3/3) without forming piezoelectric mesas by etching. A mesa is necessary to be able to run a top electrode metal pattern down the side of the piezoelectric material in an FBAR so that it can form the bottom electrode of the following FBAR. Only filters with the number of parallel FBARs less than the number of series FBARs, such as ABAAB (3/2), can be fabricated without piezoelectric material etching.

The ABBA structure can be used in other wave-guide configurations, for example, microstrip, but a greater area is taken up by the filter than when used in the ABAB configuration. For an ABBA filter within a microstrip, a transmission configuration for an electrode to be able to connect a top electrode on the piezoelectric material to a bottom electrode on the next FBAR necessitates etching a piezoelectric mesa or the use of air-bridge technology.

The top surface fabrication sequence for the filter containing 4 FBARs arranged in the ABBA configuration shown in FIG. 4 is now described. First the bottom electrode 25 metallised pattern is defined by prior art fabrication techniques. A piezoelectric layer 23 is then deposited over the whole surface.

The filter is then completed by depositing either one or two top electrode 24 metallised patterns depending on whether different metal thickness and hence different frequencies are required for the series and parallel FBARs in accordance with prior art.

The final fabrication stage is the formation of the opening 28 under insulating layer 22 by the techniques of bulk silicon etching or deep reactive etching as well known by those versed in the art.

The fabrication steps for the ABAB filter shown in FIG. 5 are similar to those for the ABBA configuration, although the order of layer fabrication varies.

Figure 6A:
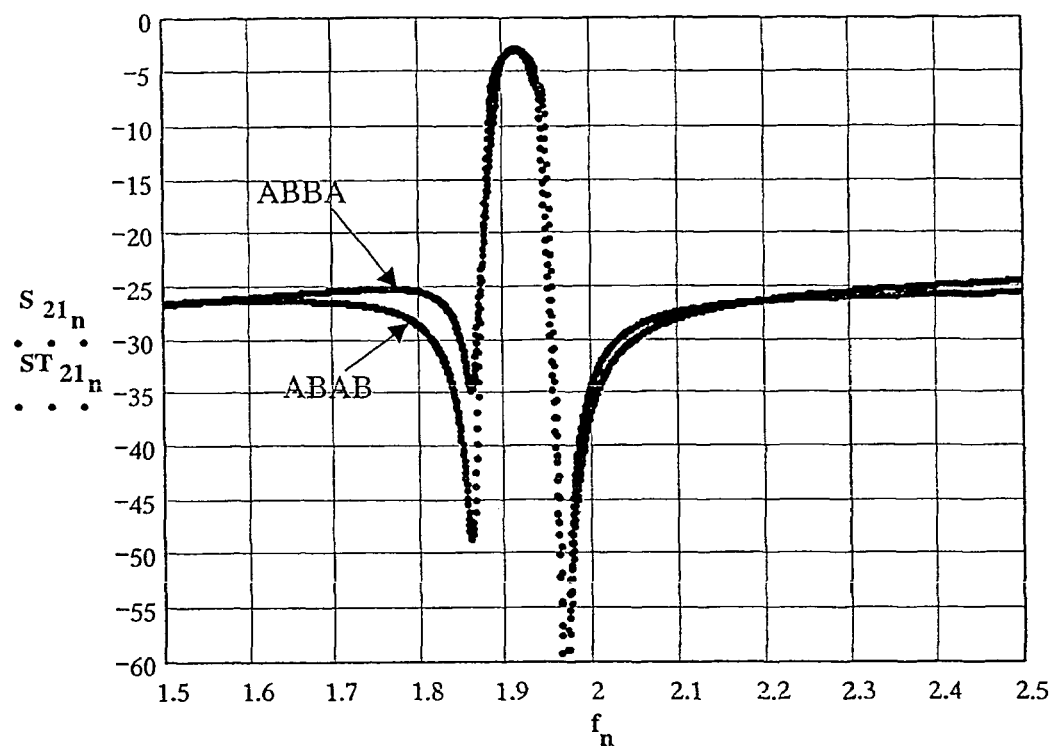
FIGS. 6A and 6B show modelled comparisons of the S-parameters of the ABAB and ABBA ladder filters shown in FIGS. 4 and 5.
Figure 6B:
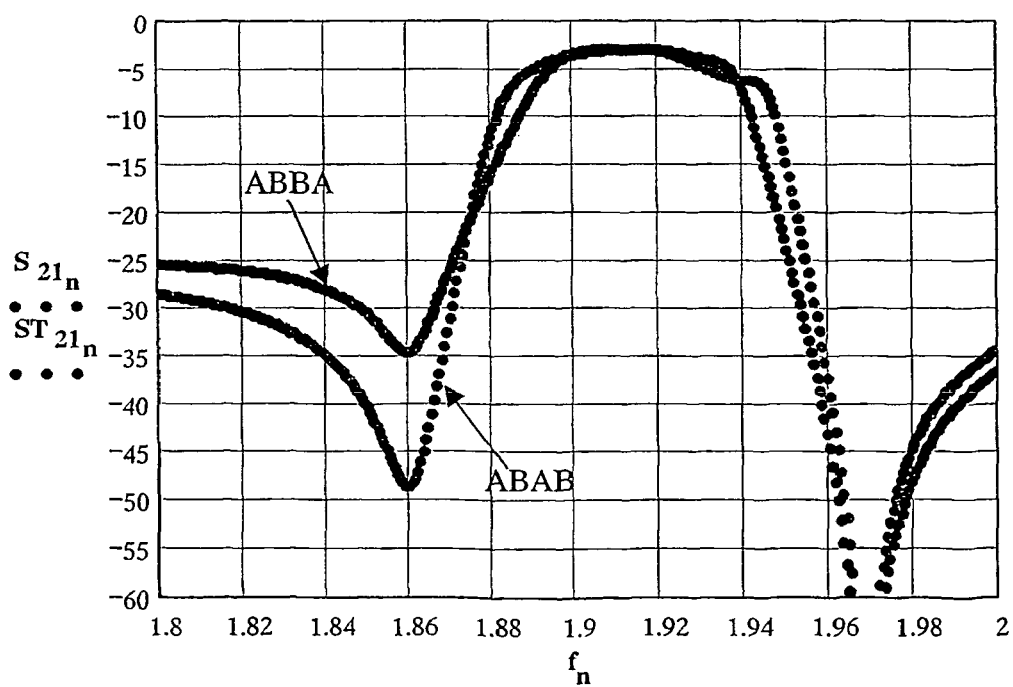
Figure 7A:
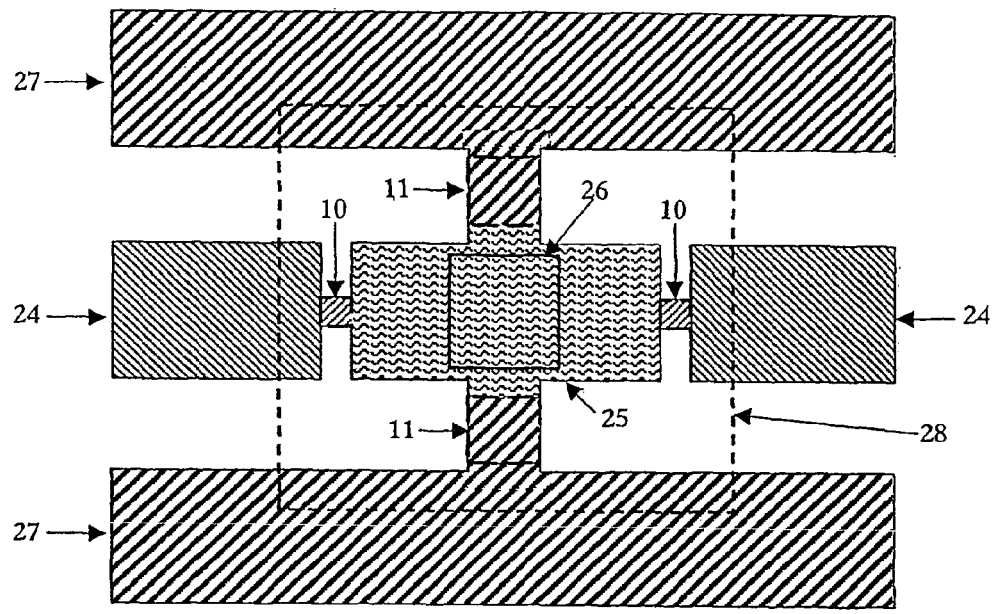
FIG. 7A is a top view of an ABBA ladder filter similar to FIG. 4 with ferroelectric layers according to a third embodiment of the invention.
Figure 7B:
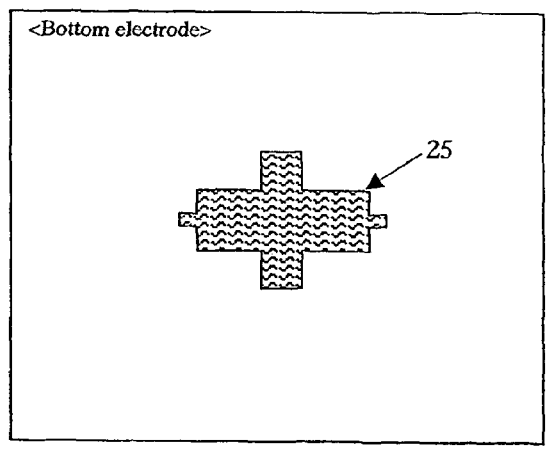
FIG. 7B shows the bottom electrode of the ABBA ladder filter shown in FIG. 7A.
Figure 7C:
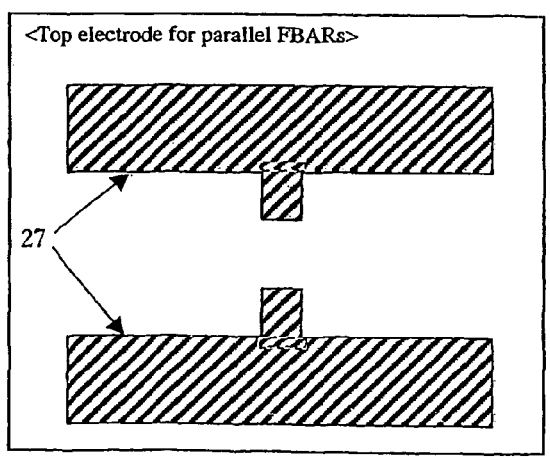
FIG. 7C shows the top electrode for the parallel FBARs of the ABBA ladder filter shown in FIG. 7A.
Figure 7D:
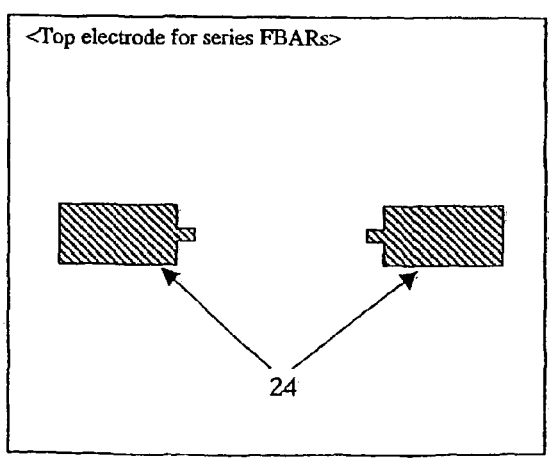
FIG. 7D shows the top electrode for the series FBARs of the ABBA ladder filter shown in FIG. 7A.

The through coefficient ($S_{21}$) of 2×2 ZnO FBAR filters having the ABAB and ABBA configurations are compared in FIGS. 6A, 6B. The filters have the same insertion loss and little difference in the out-of-band rejection. The ABAB configuration has greater close-in rejection, sharper roll-off and slightly larger bandwidth than that obtained from the ABBA configuration. The ABBA configuration can have a flatter pass-band.

A further embodiment of 2×2 ladder filter according to the invention for use with piezoelectric layers 23 that are also ferroelectric and so need to be poled is shown in FIGS. 7A–D. The fabrication procedure is identical to that for the ZnO FBAR filters described above except that a contact hole 26 is made to the common bottom electrode 25. Using this contact hole, 26, for poling in the ABBA configuration allows access to the common bottom electrode 25 eliminating the need to make multiple bottom electrode connections on a single filter. With the ABAB configuration, extra contact holes are needed for poling.

The invention claimed is:

1. An electric filter comprising:
    a plurality of film bulk acoustic resonators (FBARs) having respective top electrodes and respective bottom electrodes, and a piezoelectric layer sandwiched between the top and bottom electrodes; and
    a transmission line of a coplanar waveguide structure, the transmission line being disposed on the piezoelectric layer and having two wound lines and a signal line positioned between the two ground lines, wherein:
    the respective top electrodes of the FBARs are disposed on the piezoelectric layer; and
    the FBARs are linked in a series, as indicated by A, and parallel, as indicated by B, connection arrangement such that the top electrodes of the series FBARs form part of the signal line, while the top electrodes of the parallel FBARs are linked to one side or both sides of the two ground lines.

2. An electric filter according to claim 1, wherein the FBARs are positioned in an ABBA configuration.

3. An electric filter according to claim 1, wherein the FBARs are positioned in an ABAB configuration.

4. An electric filter according to claim 1, wherein the FBARs are positioned without air-bridges or metal tracks formed over the edge of the piezoelectric layer.

5. An electric filter according to claim 1, wherein the piezoelectric layer is made of zinc oxide.

6. An electric filter according to claim 1, wherein the piezoelectric layer is made of aluminium nitride.

7. An electric filter according to claim 1, wherein the piezoelectric layer is made of lead titanate zirconate.

8. An electric filter according to claim 1, wherein the piezoelectric layer is made of lead scandium tantalum oxide.

9. An electric filter according to claim 1, wherein the piezoelectric layer is made of bismuth sodium titanium oxide.

10. An electric filter according to claim 1, wherein access is provided to electrodes for poling ferroelectric FBAR filters.

11. A filter according to claim 1 wherein at least two of the FBARs have a common bottom electrode.

12. A ladder filter comprising:
    a plurality of series and parallel film bulk acoustic resonators (FBARs) having respective top electrodes and respective bottom electrodes, and a piezoelectric layer sandwiched between the top and bottom electrodes; and
    a transmission line of a coplanar waveguide structure, the transmission line being disposed on the piezoelectric layer and having two ground lines and a signal line positioned between the two ground lines, wherein:
    the respective top electrodes of the FBARs are disposed on the piezoelectric layer; and
    the top electrode of each series FBAR forms part of the signal line the top electrode of each parallel FBAR forms part of the ground lines.

* * * * *